United States Patent
Kong

[19]

[11] Patent Number: 6,163,193
[45] Date of Patent: Dec. 19, 2000

[54] SELF-TIMED LATCH CIRCUIT FOR HIGH-SPEED VERY LARGE SCALE INTEGRATION (VLSI)

[75] Inventor: Bai-Sun Kong, Seoul, Rep. of Korea

[73] Assignee: Hyundai Electronics Industries Co., Ltd., Ichon, Rep. of Korea

[21] Appl. No.: 09/217,201

[22] Filed: Dec. 22, 1998

[30] Foreign Application Priority Data

Dec. 26, 1997 [KR] Rep. of Korea ................. 97-74396

[51] Int. Cl.$^7$ ................... H03K 3/356; H03K 3/037
[52] U.S. Cl. ............................. 327/217; 327/208
[58] Field of Search .................. 327/217, 215, 327/199, 200, 208, 209, 210, 214, 219, 224

[56] References Cited

U.S. PATENT DOCUMENTS

| 5,124,568 | 6/1992 | Chen et al. ........................ 327/217 |
| 5,760,634 | 6/1998 | Fu ................................... 327/112 |

FOREIGN PATENT DOCUMENTS

| 355109028 | 8/1980 | Japan .............................. 327/217 |
| 362117410 | 8/1980 | Japan .............................. 327/217 |

OTHER PUBLICATIONS

David Renshaw et al., "Race–Free Clocking of CMOS Pipelines Using a Single Global Clock;" IEEE Journal of Solid–State Circuits, vol. 25, No. 3, Jun. 1990, pp. 766–769.
Morteza Afchahi et al., "A Unified Single–Phase Clocking Scheme for VLSI Systems;" IEEE Journal of Solid–State Circuits, vol. 25, No. 1, Feb. 1990, pp. 225–233.

*Primary Examiner*—Tuan T. Lam
*Attorney, Agent, or Firm*—Fleshner & Kim, LLP

[57] ABSTRACT

A self-timed latch circuit according to the present invention includes a first inverter for inverting a set signal, a second inverter for inverting a reset signal, a first main driver driven by an output signal from the second inverter and the set signal, a second main driver driven by an output signal from the first inverter and the reset signal and a static latch cross-coupled with first and second output terminals of the first and second main drivers. The self-timed latch circuit according to the present invention reduces the power consumption and increases the operation speed of the circuit by removing a back-to-back connection and a serial connection of transistors applied to the conventional art. Further, since the static latch consists of cross-coupled inverters, the self-timed latch circuit according to the present invention prevents signal fighting during the logic transition of output signals and also reduces a leakage current generated during the operation of the circuit.

33 Claims, 5 Drawing Sheets

SELF-TIMED LATCH CIRCUIT FOR HIGH-SPEED VERY LARGE SCALE INTEGRATION (VLSI)

BACKGROUND OF THE INVENTION

1. Field of the Invention

The present invention relates to a VLSI system, and more particularly to a self-timed latch circuit for a high-speed VLSI system.

2. Description of the Conventional Art

Generally, latches and flip-flops which are used as data storing devices are the most basic elements for a VLSI system. Particularly, the storing devices are mostly synchronized by clock signals. In that case, transition of the clock signal should be simultaneously occurred in all synchronizing points of of a system wherein the data storing devices (the latches and flipflops) are located. However, since in real situations the clock signal passes through a plurality of different wiring paths respectively having different loads, the clock signal arrives at each point by having a different time delay.

As a result, the change of the time delay generated while the clock signal is being dispersed results in skew of the clock signal which leads to serious problems such as, for example, false output latching. Further, in order to uniformly disperse the clock signal without any skew, increase of the design costs must be attended. Accordingly, generally a self-timed latch circuit is used for solving such problems. Since the self-timed latch circuit does not apply the clock signal, the clock skew problem and the clock dispersion costs can be reduced.

Figure 1A:
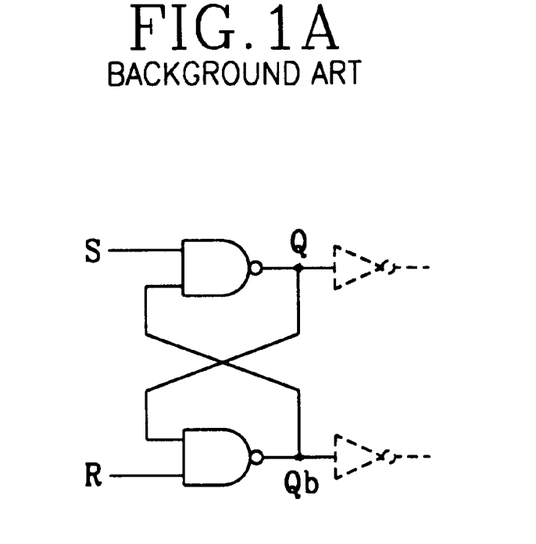
FIGS. 1A and 1B are diagrams respectively illustrating a conventional active-low and active-high self-timed latch circuits.
Figure 1B:
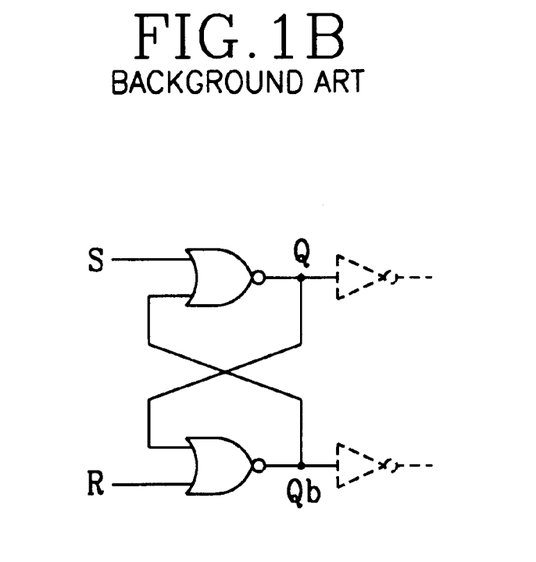

FIGS. 1A and 1B illustrate self-timed latch circuits in a SR type which are used in a synchronizing system. As shown in FIG. 1A, an active-low SR latch of a NAND type consists of NAND gates which receives external signals S, R, respectively, the NAND gates being connected to each other in a back-to-back mode. While, as shown in FIG. 1B, an active-high SR latch of a NOR type consists of NOR gates which receives external signals S, R, respectively, also the NOR gates being connected to each other in the back-to-back type. Such self-timed latch circuits have a feedback-type connecting configuration in which an output signal Q or Qb is used as an input signal of the logic gate NAND or NOR, and can be used for driving large load by which each output terminal thereof is connected with a driver inverter. Here, the external signals R, S are reset and set signals, respectively.

In the conventional self-timed latch circuit, when the external signals S, R are respectively at a high level, as shown in FIG. 1A, signal Q, Qb outputted from the NAND-type SR latch maintain previous values Q_1, Qb_1, respectively. When one of the external signals S, R is transited to a low level in such condition, a corresponding output signal becomes a high level and thereby a logic state is accordingly changed. Various changes of the output signals Q, Qb with respect to the external signals S, R are illustrated as a truth table in Table 1.

TABLE 1

| SET | RESET | Q | Qb |
|---|---|---|---|
| 1 | 1 | Q_1 | Qb_1 |
| 0 | 1 | 1 | 0 |
| 1 | 0 | 0 | 1 |
| 0 | 0* | 1 | 1 |

*not allowed

While, as shown in FIG. 1B, when the external signals S, R are respectively at a low level, signals Q, Qb outputted from the NOR-type SR latch maintain previous values Q_1, Qb_1, respectively. When one of the external signals S, R is transited to a high level in such condition, a logic state of a corresponding output signal is accordingly changed. In table 2, various changes of the output signals Q, Qb with respect to the external signals S, R are illustrated as a truth table in following Table 2.

TABLE 2

| SET | RESET | Q | Qb |
|---|---|---|---|
| 0 | 0 | Q_1 | Qb_1 |
| 1 | 1 | 1 | 0 |
| 1 | 0 | 0 | 1 |
| 1* | 1* | 0 | 0 |

*not allowed

However, the conventional self-timed latch circuit has several problems due to the back-to-back connection. More specifically, a critical path formed by the feedback connection considerably decreases a processing speed of the latch circuit. Such decrease of the processing speed thereof becomes more serious as load of a output terminal becomes large, because the output terminal having the large load exists on the critical path.

In addition, since the conventional self-timed latch circuit has a serial output system by the feedback connection, there must be time difference between the output signals Q, Qb. Therefore, the output signals Q, Qb are generated asymmetrically, and thus it is impossible to supply stable signals to a circuit which requires both of the output signals Q, Qb.

Further, the conventional self-timed latch circuit of the NAND or NOR type has a serial connection of an NMOS or PMOS transistor. Therefore, the serial connection configuration unavoidably increases the size of the transistor and decreases the processing speed. Particularly, those problems are more seriously induced in the NOR-type SR latch having the serial connection of the PMOS transistor, and also there is large difference in performance between the conventional active-low and active-high self-timed latch circuits.

SUMMARY OF THE INVENTION

Accordingly, the present invention is directed to a self-timed latch circuit which obviates the problems and disadvantages due to the conventional art.

An object of the present invention is to provide a self-timed latch circuit that reduces the power consumption and increases the operation speed of the circuit by removing a back-to-back connection and a serial connection of transistors which lead to decrease of the operation speed.

Another object of the present invention is to provide a self-timed latch circuit that achieves a symmetric state of output signals by virtue of a parallel output system and reduces difference in the performance between active-low and active-high self-timed latch circuits.

Still another object of the present invention is to provide a self-timed latch circuit that reduces size of a device and a cross-over-current generated during the operation of the circuit.

To achieve these and other advantages and in accordance with the purpose of the present invention, as embodied and broadly described, a self-timed latch circuit includes a first inverter for inverting a set signal, a second inverter for inverting a reset signal, a first main driver driven by an output signal from the second inverter and the set signal, a second main driver driven by an output signal from the first inverter and the reset signal and a static latch cross-coupled with first and second output terminals of the first and second main drivers.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 2A:
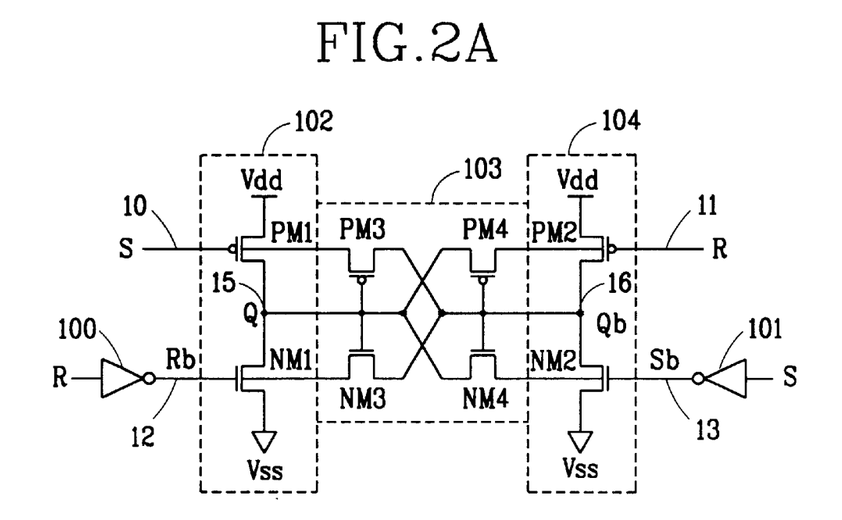
FIGS. 2A and 2B are diagrams respectively illustrating an active-low and active-high self-timed latch circuits according to a first embodiment of the present invention.
Figure 2B:
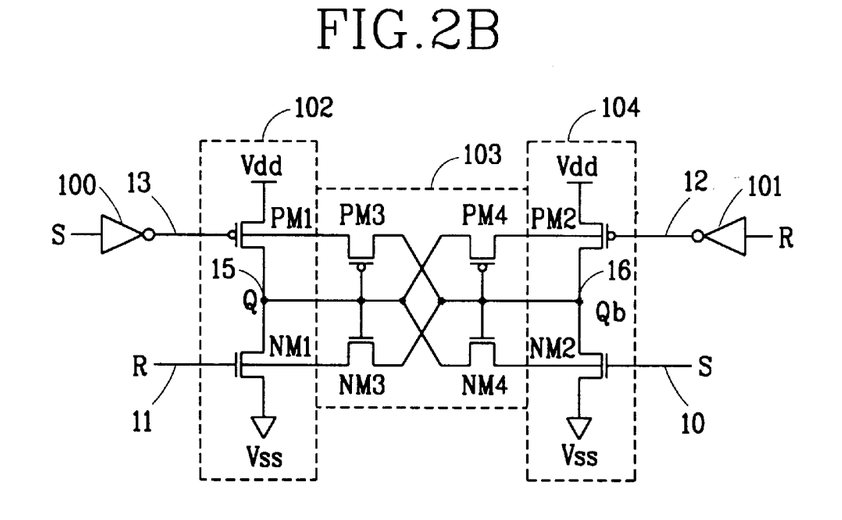

A self-timed latch circuit according to a first embodiment of the present invention is, as shown in FIGS. 2A and 2B which respectively illustrates an active-low self-timed latch circuit and an active-high self-timed latch circuit, is comprised of a couple of inverters 100, 101, a couple of main drivers 102, 104 and a static latch 103.

More specifically, in the active-low self-timed latch circuit of FIG. 2A, the inverters 100, 101 invert external signals R, S to thereby generate internal signals Rb, Sb, respectively, and the main drivers 102, 104 respectively consists of p-type pull-up and n-type pull-down transistors PM1, NM1 and p-type pull-up and n-type pull-down transistors PM2, NM2 which are, respectively, serially connected between a power source voltage Vdd and a ground voltage Vss. Here, the external signals R, S are a reset signal and a set signal, respectively. Further, gates of the pull-up transistors PM1, PM2 are connected with input terminals 10, 11 of the set and reset signals S, R, respectively, while gates of the pull-down transistors NM1, NM2 are connected with input terminals 12, 13 of the internal signals Rb, Sb, respectively.

The static latch 103 is comprised of two cross-coupled inverters. Specifically, a first cross-coupled inverter is provided with a p-type transistor PM3 and an n-type transistor NM3 having sources respectively connected with the input terminals 10, 12 and gates and drains commonly connected with output terminals 15, 16, respectively, and a second cross-coupled inverter consists of a p-type transistor PM4 and an n-type transistor NM4 having sources respectively connected with the input terminals 11, 13 and gates and drains commonly connected with output terminals 15, 16, respectively.

The active-high self-timed latch circuit, as shown in FIG. 2B, has a configuration identical to the active-low self-timed latch circuit of FIG. 2A, except for which the inverters 100, 101 are connected with the gates of the p-type pull-up transistors PM1, PM2.

In such self-timed latch circuit of the first embodiment, assuming the set and reset signals S, R are at a high level, all of the transistors in the main drivers 102, 104 are turned off and in the static latch 103 the transistors NM3, PM4 are turned off while the transistors PM3, NM4 are turned on. As a result, the output terminal 15 is connected through the turned-on transistor PM4 with the input terminal 13, the output terminal 16 is connected through the turned-on transistor PM3 with the input terminal 10 and thereby the output signals Q, Ob maintain low and high levels which are initial states, respectively.

In such condition, when the set signal S is transited to a low level, the transistors PM1, PM2 are turned on and thus the output signals Q, Qb are transited to high and low levels, respectively, irrespective of the previous state. Therefore, each logic transition speed of the output signals Q, Qb increases by which other driving paths are supplied to the output terminals 15, 16. That is, no signal fighting occurs between the output signals Q, Qb and the previous outputs Q_1, Qb_1, respectively, in the static latch 103 during the logic transition of the output signals Q, Qb and the logic transition speed of the output signals Q, Qb is increased by the operation of the transistors NM3, NM4.

Next, when the set signal S again becomes the high level, the transistors PM1, PM2 are turned off and thus the output signals Q, Qb at high and low levels, respectively, are latched by the static latch 103. That is, the output signals Q, Qb maintain the current levels by which the output terminal 15 is connected with the input terminal 11 through the turned-on transistor PM4 and the output terminal 16 is connected through the turned-on transistor NM3 with the input terminal 12 of the internal signal Rb.

Similarly, when the reset signal R is transited to the low level, the output signals Q, Qb are transited to the low and high levels, respectively, and when the reset signal R again becomes the high level, the output signals Q, Qb are latched by the operation of the static latch 103. Also, when set and reset signals S, R are all transited to the low level, all of the output signals Q, Qb become the high level and thus the active-low self-timed latch circuit is to be set. As described above, the change of the output signals Q, Qb in the active-low self-timed latch circuit is the same as the NAND-type SR latch in Table 1.

While, since the active-high self-timed latch circuit of FIG. 2B has the configuration identical to the active-low self-timed latch circuit 2A, except for the output terminals of the inverters 100, 101 being connected with the gates of the P-type transistors of the main drivers 102, 104, respectively, the operation of the circuit is identical to that of the active-low self-timed latch circuit excluding the polarity of the external signals R, S.

In other words, in the active-low self-timed latch circuit, when the set and reset signals S, R are the high level, the output signals Q, Qb are latched and when one of the set and reset signals S, R becomes the high level, the levels of the output signals Q, Qb are accordingly transited. In addition, when all of the set and reset signals S, R become the high level, the output signals Q, Qb are transited to the low level and thus the active-high self-timed latch circuit becomes the set state. Further, the change of the output signals Q, Qb in the active-high self-timed latch circuit is the same as the NOR-type SR latch in Table 2.

As mentioned above, in the self-timed latch circuit according to the present invention the back-to-back connection mode which has been applied to the conventional art is eliminated and the output terminals 15, 16 respectively have independent output systems (parallel output systems). Although the cross-coupled inverters of the static latch 103 establish the back-to-back connection, such connection does not mean that the output terminals 15, 16 of the main drivers 102, 104 have the back-to-back connection as in the conventional art. In addition, according to the present invention the output signals Q, Qb are simultaneously generated in accordance with the parallel output system, without having the time difference which was one of the main problems in the conventional art due to the serial output system.

In general, in a driver consisting of inverters, when input signals are transited, PMOS and NMOS transistors are simultaneously turned on. In that case, a cross-over-current is excessively passed from a power source voltage Vdd side to the ground, which disadvantageously affects the current consumption and processing speed. While, in the present invention when the different signals are supplied to the gates of the main drivers 102, 104, to thereby turn on only one transistor, the other transistor is designed to be turned off all the time and thus the cross-over-current is eliminated. Accordingly, all of the currents are used for charge and discharge of the output terminals 10, 16 for thereby increasing the output transition speed.

While, the static latch 103 performs compensating of a leakage current in the output terminals 15, 16. More specifically, assuming that one of the main drivers 102, 104 is only provided, if no the logic transition of the output signals S, R occurs, the output terminals 15, 16 become floating states, so that the leakage currents are generated in the output terminals 15, 16 and even more seriously data loss may be incurred. Therefore, according to the present invention, the static latch 103 is provided and connected between the two main drivers 102, 104 to thereby compensate the leakage current and also prevent the data loss. Also, because volume of the leakage current is minute, a width of each transistor in the static latch 103 can be designed smaller than that of the transistors in the main driver 102, 104. Further, in the static latch 103 no signal fighting occurs during the logic transition of the output signals Q, Qb and the logic transition speed of the output signals Q, Qb accordingly increases.

Figure 3A:
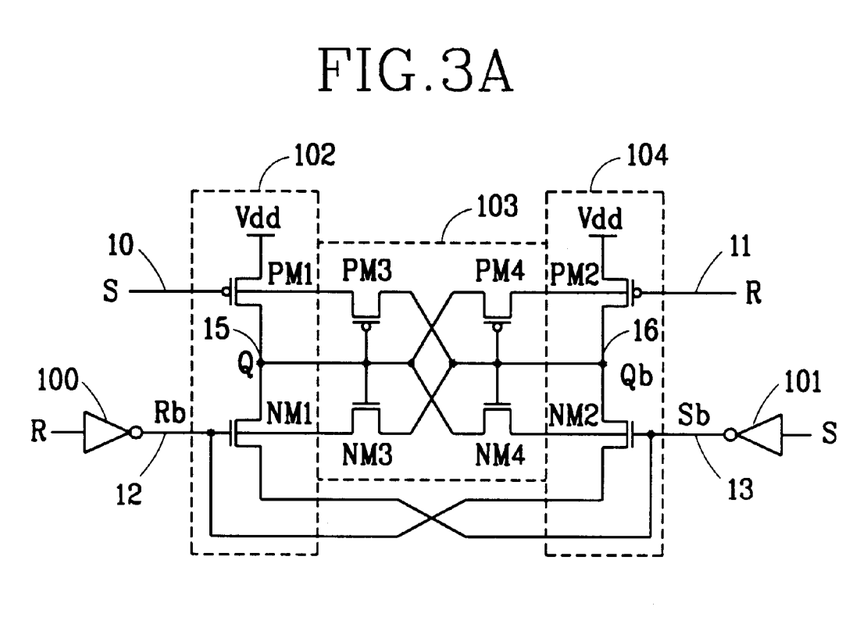
FIGS. 3A and 3B are diagrams respectively illustrating an active-low and active-high self-timed latch circuits according to a second embodiment of the present invention.
Figure 3B:
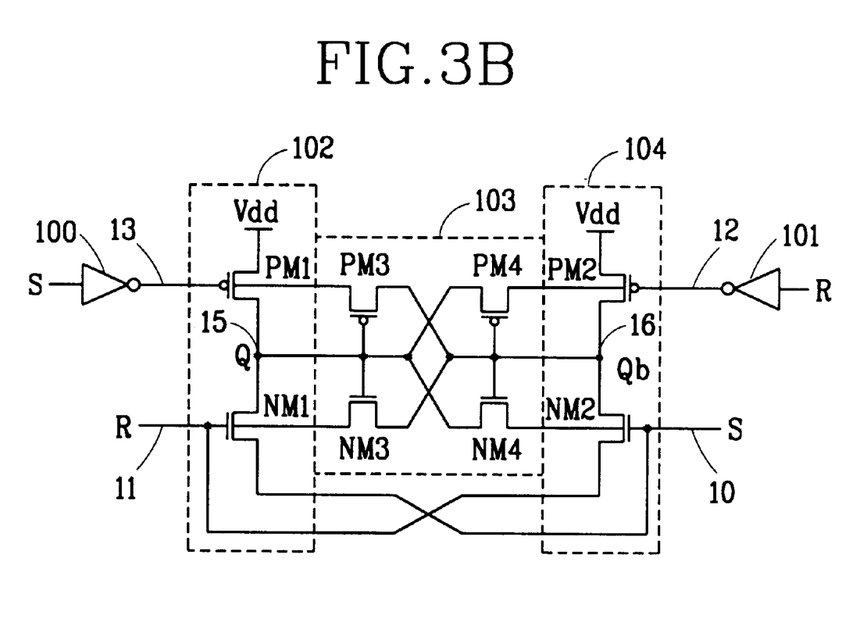

FIGS. 3A and 3B illustrate active-low and active-high self-timed latch circuits, respectively, according to a second embodiment of the present invention.

Such self-timed latch circuit according to the second embodiment is provided for preventing the excessive current consumption by restraining the cross-over-current I from flowing from the power supply Vdd to the ground when the external signals S, R are activated by, for example, noises. In order to achieve the above object, the connection between the main drivers 102, 104 as in FIGS. 2A and 2B is changed and configured such that in case of the active-low self-timed latch circuit, as shown in FIG. 3A, the source of the transistor NM1 is connected with the input terminal 13 of the input signal Sb and the source of the transistor NM2 is connected with the input terminal 12 of the input signal Rb, while in case of the active-high self-timed latch circuit, as shown in FIG. 3B, the source of the transistor NM1 is connected with the input terminal 10 of the set signal S and the source of the transistor NM2 is connected with the input terminal 11 of the reset signal R. Such connection of the main drivers 102, 104 enables the latch circuit according to the present invention to prevent the flow of the cross-over-current I from the power source voltage Vdd side to the ground.

Figure 4A:
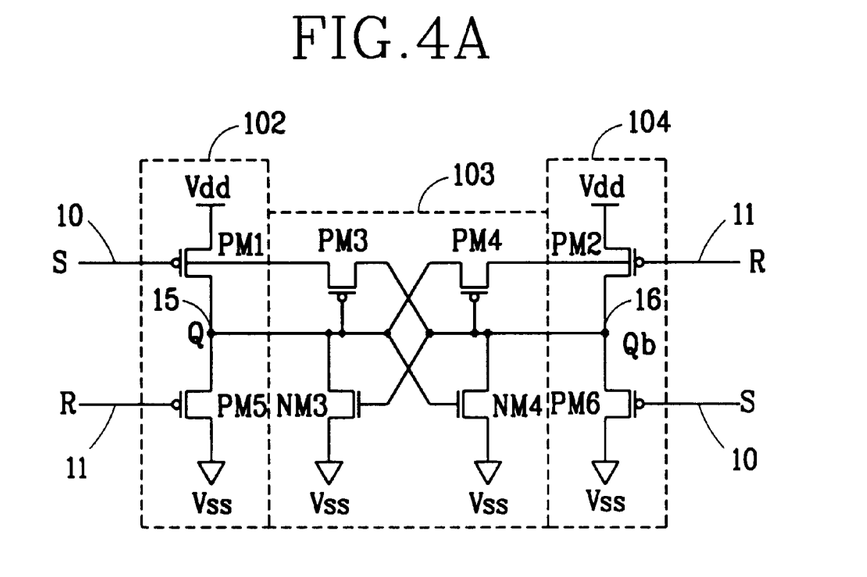
FIGS. 4A and 4B are diagrams respectively illustrating an active-low and active-high self-timed latch circuits according to a third embodiment of the present invention.
Figure 4B:
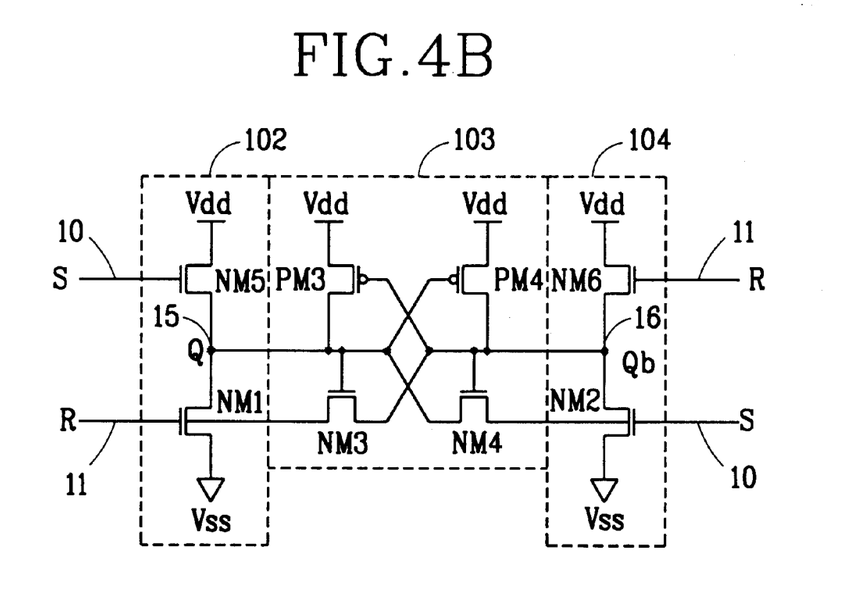

Further, FIGS. 4A and 4B illustrate active-low and active-high self-timed latch circuits, respectively, according to a third embodiment of the present invention, wherein the input inverters 100, 101 as provided in the first and second embodiments are eliminated to thereby reduce the number of the devices. However, the operation same as FIGS. 2A and 2B is applied to FIGS. 4A and 4B according to the third embodiment of the present invention.

To achieve such configuration, the connection between main drivers 102, 104 and the static latch 103 as shown in FIGS. 2A and 2B is changed such that in case of the active-low self-timed latch circuit, as shown in FIG. 4A, the n-type transistors NM1, NM2 of the main drivers 102, 104 as in FIG. 2A are substituted for p-type transistors PM5, PM6, respectively, and then gates of the transistors PMS, PM6 are directly connected with the input terminals 11, 10 of the reset signal R and set signal S, respectively. Next, in the static latch 103 the n-type transistors NM3, NM4 are connected between the ground voltage Vss and the output terminals 15, 16, respectively, and the gates of the transistors NM3, NM4 are connected with the output terminals 16, 15, respectively.

While in case of the active-high self-timed latch circuit as shown in FIG. 4B the p-type transistors PM1, PM2 of the main drivers 102, 104 in FIG. 2B are substituted for n-type transistors NM5, NM6, respectively, and then gates of the transistors NM5, NM6 are directly connected with the input terminals 10, 11 of the set signal S and the reset signal R, respectively. Next, in the static latch 103 the transistor PM3 is connected between the power source voltage Vdd and the output terminal 15 so that the gate of the transistor PM3 may receive the output signal Qb, and the transistor PM4 is connected between the power source voltage Vdd and the output terminal 16 so that the gate of the transistor PM4 may receive the output signal Q. Accordingly, the couple of inverters 100, 101, that is the four transistors can be eliminated in the self-timed latch circuit according to third embodiment.

Figure 5A:
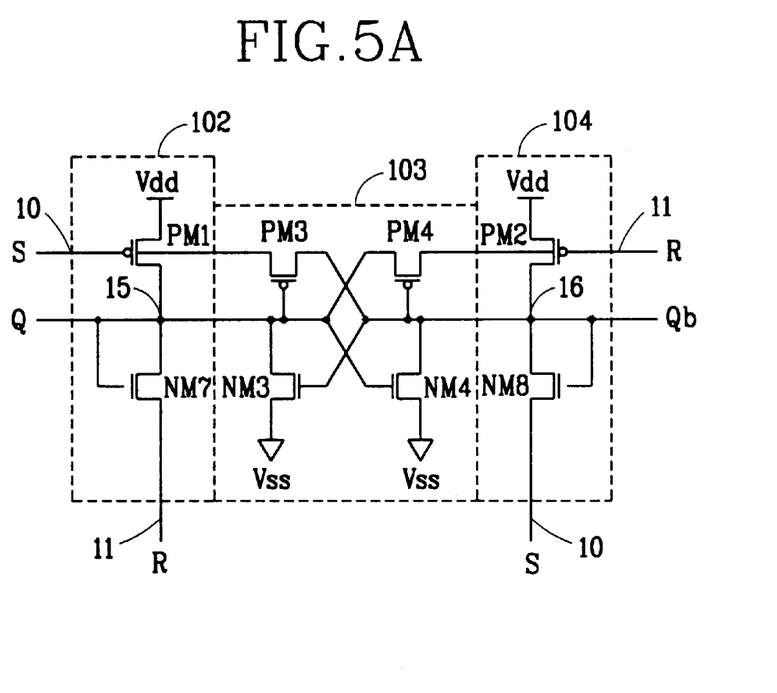
FIGS. 5A and 5B are diagrams respectively illustrating an active-low and active-high self-timed latch circuits according to a fourth embodiment of the present invention.
Figure 5B:
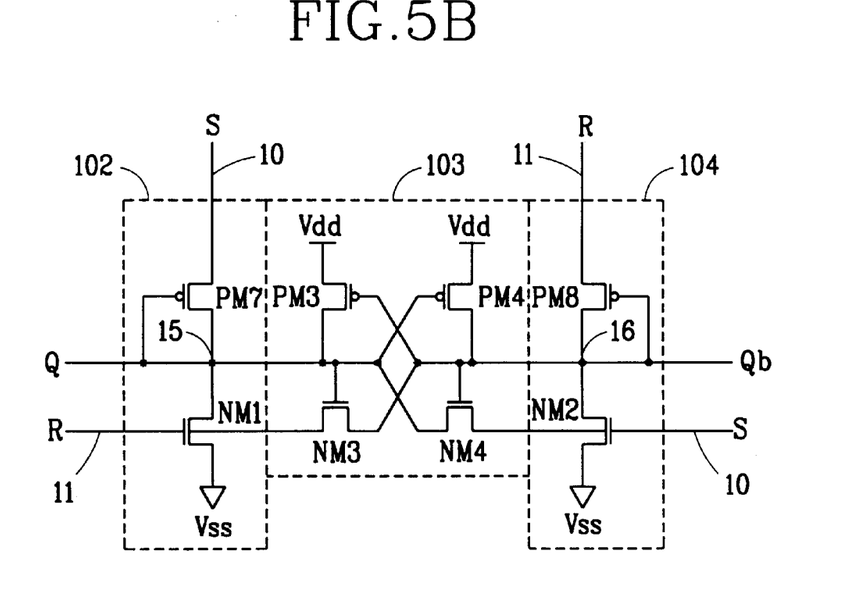

FIGS. 5A and 5B illustrate active-low and active-high self-timed latch circuits, respectively, according to a fourth embodiment of the present invention, wherein the connection of the main drivers 102, 104 are changed to reduce the number of devices. However, the operation of FIGS. 5A and 5B is the same as that of FIGS. 2A and 2B. In order to constitute the active-low self-timed latch circuit in FIG. 5A, the p-type transistors PM5, PM6 as in FIG. 4A are substituted for n-type transistors NM7, NM8 and sources of the transistors NM7, NM8 are respectively connected with the input terminals 11, 10 of the external signals R, S and gates thereof are connected with the output terminals 15, 16, respectively. Further, for the active-high self-timed latch circuit of FIG. 5B, the n-type transistors NM5, NM6 shown in FIG. 4B are substituted for n-type transistors PM7, PM8 and sources of the transistors PM7, PM8 are respectively connected with the input terminals 10, 11 of the external signals S, R and gates thereof are connected with the output terminals 15, 16, respectively. Such configuration can also reduce the two inverters 100, 101, that is four transistors.

As described above, the self-timed latch circuit according to the present invention has several advantages. Specifically, since the back-to-back connection and the serial connection of the transistors applied to the conventional art are eliminated in the self-timed latch circuit according to the present invention to thereby increase the operation speed. In other words, no serial connection of the n-type or p-type transistors is provided in the present invention as in the conventional NAND or NOR, but the single pull-up or pull-down transistor is only constructed, which has prominent effects on the operation speed size of the device, because due to the size reduction of the transistor the parasitic component decreases and eventually the power consumption is reduced.

Also, the self-timed latch circuit according to the present invention has an effect of restraining the cross-over-current which is generated during the transition of the input signal by supplying the input signals having different levels to the main drivers. Namely, in the present invention the cross-over-current can be removed, since the other transistor is always turned off, when one transistor is turned on in the main driver.

Further, since the static latch consists of the cross-coupled inverters, the self-timed latch circuit of the present invention prevents the signal fighting during the logic transition of the output signals and also increases the noise margin by adequately compensating the leakage current, which have the effect of shortening the width of the transistors.

Lastly, the self-timed latch circuit according to the present invention has the parallel output system without having the back-to-back connection, differently from the convention art which has the serial output system using the logic gates. As a result, the present invention achieves the symmetric state of the output signals by virtue of the parallel output system and the difference in the performance between the active-low and active-high self-timed latch circuits can be reduced.

It will be apparent to those skilled in the art that various modifications and variations can be made in the self-timed latch circuit of the present invention without departing from the spirit or scope of the invention. Thus, it is intended that the present invention cover the modifications and variations of this invention provided they come within the scope of the appended claims and their equivalents.

What is claimed is:

1. A self-timed latch circuit responsive to first and second signals and inverted first and second signals, comprising:
   a first main driver driven by the first signal and the inverted second signal;
   a second main driver driven by the second signal and the inverted first signal; and
   a latch cross-coupled with first and second output terminals of the first and second main drivers, said latch having first and second transistors, each transistor having first and second electrodes and a control electrode, wherein first electrodes and control electrodes of the first and second transistors are commonly coupled to the first and second output terminals, respectively, and the second electrode of the first transistor is coupled for receiving the second signal and the second electrode of the second transistor is coupled for receiving the inverted first signal.

2. The self-timed latch circuit of claim 1, wherein the second signal is a set signal and the first signal is a reset signal.

3. The self-timed latch circuit of claim 1, wherein the first output terminal is a non-inversion output terminal and the second output terminal is an inversion output terminal.

4. The self-timed latch circuit of claim 1, wherein said latch further comprises third and fourth transistors, each transistor includes first and second electrodes and a control electrode, the first electrodes and the control electrodes of the third and fourth transistors being commonly coupled to the first output terminal and second output terminal, respectively, and the second electrode of the third transistor coupled for receiving the first signal and the second electrode of the fourth transistor coupled for receiving the inverted second signal.

5. The self-timed latch circuit of claim 4, wherein the first signal is the reset signal and the second signal is the signal, and the first output terminal is a non-inversion output terminal of the first main driver and the second output terminal is an inversion output terminal of the second main driver.

6. The self-timed latch circuit of claim 4, further comprising a first inverter to provide the inverted first signal and a second inverter to provide the inverted second signal.

7. The self-timed latch circuit of claim 4, further comprising a first inverter to provide the first signal and a second inverter to provide the second signal.

8. The self-timed latch circuit of claim 4, wherein the first main driver includes serially coupled first and second MOS transistors having gates for receiving the second signal and the inverted first signal, respectively, and the second main driver includes serially coupled third and fourth MOS transistors having gates for receiving the first signal and the inverted second signal, respectively.

9. The self-timed latch circuit of claim 8, wherein each of the first and third MOS transistors is a p-type and each of the second and fourth MOS transistors is an n-type.

10. The self-timed latch circuit of claim 8, wherein a source of the second MOS transistor is coupled to the gate of the fourth MOS transistor and a source of the fourth MOS transistor coupled to the gate of the second MOS transistor.

11. The self-timed latch circuit claim 4, wherein the first main driver includes first and second MOS transistors having gates for receiving the second signal and the inverted first signal, respectively, and serially connected for connection between a power source voltage and a ground voltage, and the second main driver includes third and fourth MOS transistors having gates for receiving the first signal and the inverted second signal, respectively, and serially connected for connection between the power source voltage and the ground voltage.

12. The self-timed latch circuit of to claim 11, wherein each of the first and third MOS transistors is a p-type and each of the second and fourth MOS transistors is an n-type, and the first signal is the reset signal and the second signal is the reset signal.

13. The self-timed latch circuit of claim 4, wherein the first, second, third and fourth transistors are PMOS and NMOS transistors such that the first and second electrodes of the PMOS and NMOS transistors are drain and source, respectively, and the control electrode is the gate electrode.

14. The self-timed latch circuit of claim 1, wherein the first and second transistors are PMOS and NMOS transistors such that the first and second electrodes of the PMOS and NMOS transistors are drain and source, respectively, and the control electrode is the gate electrode.

15. A self-timed latch, comprising:
   first and second main drivers driven by first and second signals; and
   a latch cross-coupled with first and second output terminals of the first and second main drivers, wherein said latch includes
   (1) a first transistor having first and second electrodes and a control electrode, the first electrode being coupled for receiving the first signal, the control electrode being coupled to the first output terminal and the second electrode being coupled to the second output terminal, and
   (2) a second transistor having first and second electrodes and a control electrode, the first electrode being coupled for receiving a prescribed voltage, the second electrode coupled to the first output terminal, and the control electrode being coupled to the second output terminal.

16. The self-timed latch circuit of claim 15, wherein the first signal is a set signal and the second signal is a reset signal, and the first output terminal is a non-inversion output terminal and the second output terminal is an inversion output terminal.

17. The self-timed latch circuit of claim 15, wherein said latch further comprises:
   (3) a third transistor having first and second electrodes and a control electrode, the first electrode coupled for receiving the second signal, the control electrode coupled to the second output terminal, and the second electrode coupled to the first output terminal; and
   (4) a fourth transistor having first and second electrodes and a control electrode, the first electrode being coupled for receiving the prescribed voltage, the gate electrode being coupled to the first output terminal, and the second electrode being coupled to the second output terminal.

18. The self-timed latch circuit of claim 17, wherein said first and third transistors are PMOS transistors such that the first, second and control electrodes are source, drain and gate electrode, respectively, and the second and fourth transistors are NMOS transistors such that the first, second and control electrodes are source, drain and gate electrode, respectively.

19. The self-timed latch circuit of claim 17, wherein the first signal is the set signal and the second signal is the reset signal, and the first output terminal is the non-inversion output terminal and the second output terminal is the inversion output terminal.

20. The self-timed latch circuit of claim 17, wherein the first main driver includes first and second MOS transistors having gates for receiving the first and second signals, respectively, and serially connected between a power source voltage and the prescribed voltage, and the second main driver includes third and fourth MOS transistors having gates for receiving the second and first signals, respectively, and serially connected between the power source voltage and the prescribed voltage.

21. The self-timed latch circuit of claim 20, wherein each of the first to fourth MOS transistors is a p-type.

22. The self-timed latch circuit of claim 17, wherein the prescribed voltage is a ground voltage.

23. The self-timed latch circuit of claim 17 wherein the first main driver includes first and second MOS transistors serially connected between a power source voltage and an input terminal of the second signal and having gates respectively connected with an input terminal of the first signal and the first output terminal and the second main driver includes third and fourth MOS transistors serially connected between the power source voltage and the input terminal of the first signal and having gates respectively connected with the input terminal of the second signal and the second output terminal.

24. The self-timed latch circuit of claim 23, wherein the first and third MOS transistors are p-type and second and fourth transistors are n-type.

25. The self-timed latch circuit of claim 17, wherein the first main driver includes first and second MOS transistors serially connected between an input terminal of the first signal and the prescribed voltage and having gates respectively connected with the first output terminal and an input terminal of the second signal and the second main driver includes third and fourth MOS transistors serially connected between the input terminal of the second signal and the prescribed voltage and having gates respectively connected with the second output terminal and the input terminal of the first signal.

26. The self-timed latch circuit of claim 25, wherein the first and third MOS transistors are p-type and second and fourth MOS transistors are n-type.

27. A self-timed latch, comprising:
   first and second main drivers driven by first and second signals; and
   a latch cross-coupled with first and second output terminals of the first and second main drivers, wherein said latch includes
   (1) a first transistor having first and second electrodes and a control electrode, the first electrode being coupled for receiving a prescribed voltage, the control electrode being coupled to the second output terminal and the second electrode being coupled to the first output terminal, and
   (2) a second transistor having first and second electrodes and a control electrode, the first electrode being coupled for receiving the second signal, the second electrode coupled to the second output terminal, and the control electrode being coupled to the first output terminal.

28. The self-timed latch circuit of claim 27, wherein said latch further comprises:
   (3) a third transistor having first and second electrodes and a control electrode, the first electrode coupled for receiving the prescribed voltage, the control electrode coupled to the first output terminal, and the second electrode coupled to the second output terminal; and
   (4) a fourth transistor having first and second electrodes and a control electrode, the first electrode being coupled for receiving the first signal, the gate electrode being coupled to the second output terminal, and the second electrode being coupled to the first output terminal.

29. The self-timed latch circuit of claim 28, wherein said first and third transistors are PMOS transistors such that the first, second and control electrodes are source, drain and gate electrode, respectively, and the second and fourth transistors are NMOS transistors such that the first, second and control electrodes are source, drain and gate electrode, respectively.

30. The self-timed latch circuit of claim 28, wherein the prescribed voltage is a source voltage.

31. The self-timed latch of claim 28, wherein the first main driver includes first and second MOS transistors having gates for receiving the first and second signals, respectively, and serially connected between a power source voltage and the prescribed voltage, and the second main driver includes third and fourth MOS transistors having gates for receiving the second and first signals, respectively, and serially connected between the power source voltage and the prescribed voltage.

32. The self-timed latch of claim 31, wherein each of the first to fourth MOS transistors is an n-type.

33. The self-timed latch circuit of claim 28, wherein the first signal is the set signal and the second signal is the reset signal, and the first output terminal is the non-inversion output terminal and the second output terminal is the inversion output terminal.

\* \* \* \* \*